United States Patent
Riedel

(10) Patent No.: US 9,627,493 B2
(45) Date of Patent: Apr. 18, 2017

(54) FORMING A CONDUCTIVE CONNECTION BETWEEN A COMMON ELECTRODE OF AN OPTICAL FRONT PLANE AND AN ELECTRICAL CONTACT PART OF AN OPPOSITE BACK PLANE

(71) Applicant: FLEXENABLE LIMITED, Cambridge (GB)

(72) Inventor: Stephan Riedel, Dresden (DE)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 14/422,577

(22) PCT Filed: Aug. 20, 2013

(86) PCT No.: PCT/EP2013/067313
§ 371 (c)(1),
(2) Date: Feb. 19, 2015

(87) PCT Pub. No.: WO2014/029771
PCT Pub. Date: Feb. 27, 2014

(65) Prior Publication Data
US 2015/0206944 A1    Jul. 23, 2015

(30) Foreign Application Priority Data

Aug. 20, 2012  (GB) .................. 1214812.8

(51) Int. Cl.
*H01L 29/417* (2006.01)
*G02F 1/1345* (2006.01)
(Continued)

(52) U.S. Cl.
CPC ...... *H01L 29/41733* (2013.01); *G02F 1/1341* (2013.01); *G02F 1/1345* (2013.01); *G02F 1/1368* (2013.01); *G02F 1/13306* (2013.01); *G02F 1/136227* (2013.01); *H01L 21/76802* (2013.01); *H01L 21/76877* (2013.01); *H01L 21/76897* (2013.01); *H01L 27/124* (2013.01); *H01L 27/1248* (2013.01);
(Continued)

(58) Field of Classification Search
CPC ............ H01L 29/41733; H01L 27/124; H01L 27/1248; H01L 27/1259; H01L 21/76802; H01L 21/76877; H01L 21/76897; G02F 1/1341; G02F 1/136227; G02F 1/1368; G02F 1/13306; G02F 1/1345
USPC ............ 257/774; 438/666; 439/139, 147, 42
See application file for complete search history.

(56) References Cited

U.S. PATENT DOCUMENTS

| 6,433,841 | B1 * | 8/2002 | Murade | G02F 1/13454 349/110 |
| 2008/0024708 | A1 * | 1/2008 | Park | G02F 1/1345 349/139 |
| 2008/0129898 | A1 * | 6/2008 | Moon | G02F 1/13338 349/12 |

* cited by examiner

*Primary Examiner* — David Vu
*Assistant Examiner* — Mouloucoulaye Inoussa
(74) *Attorney, Agent, or Firm* — Sughrue Mion, PLLC

(57) ABSTRACT

A technique for creating a conductive connection between a contact part (24) of a display back plane (34) and a common electrode (20) of a display front plane (32), comprising the step of compressing a compressible conductive component (30) between the display front plane (32) and the display back plane (34), wherein the method further comprises the step of interposing one or more layers (10, 36) having a low modulus of elasticity not larger than 5 GPa between the contact part (24) and the compressible conductive component (30) prior to the compressing step.

12 Claims, 4 Drawing Sheets

Figure 1:
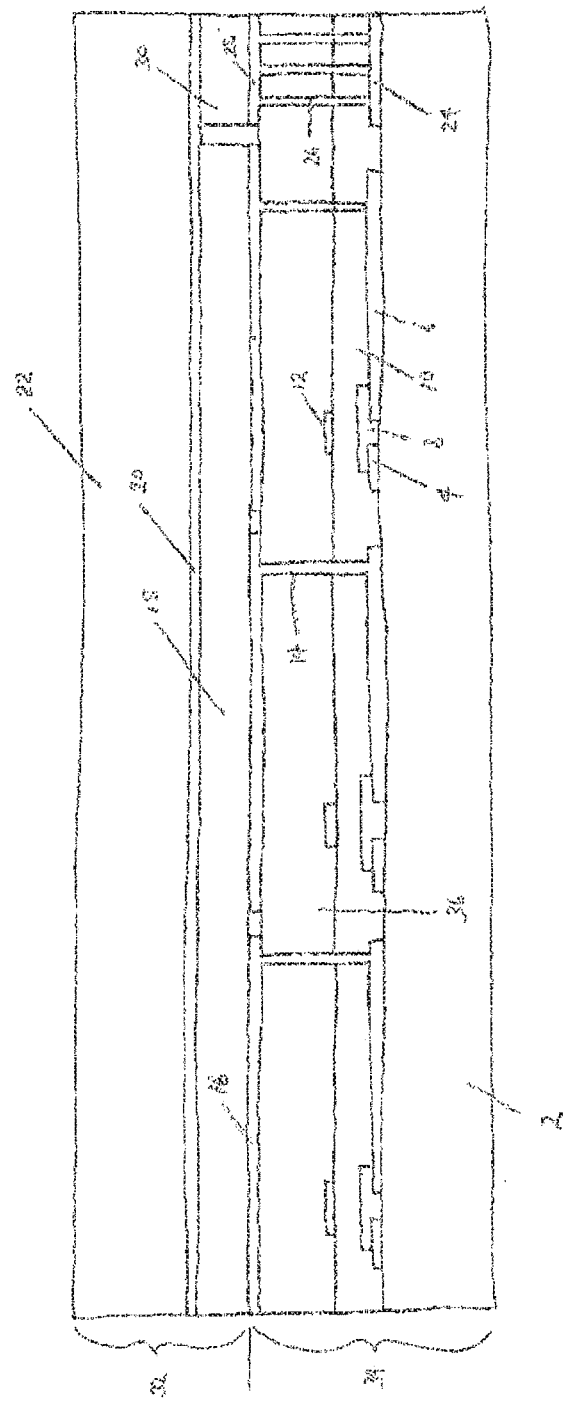

(51) Int. Cl.
*G02F 1/1362* (2006.01)
*G02F 1/133* (2006.01)
*G02F 1/1341* (2006.01)
*G02F 1/1368* (2006.01)
*H01L 21/768* (2006.01)
*H01L 27/12* (2006.01)

(52) U.S. Cl.
CPC .... *H01L 27/1259* (2013.01); *G02F 2201/121* (2013.01); *G02F 2201/50* (2013.01); *G02F 2202/28* (2013.01)

FORMING A CONDUCTIVE CONNECTION BETWEEN A COMMON ELECTRODE OF AN OPTICAL FRONT PLANE AND AN ELECTRICAL CONTACT PART OF AN OPPOSITE BACK PLANE

CROSS REFERENCE TO RELATED APPLICATIONS

This application is a National Stage of International Application No. PCT/EP2013/067313 filed Aug. 20, 2013, claiming priority based on British Patent Application No. 1214812.8 filed Aug. 20, 2012, the contents of all of which are incorporated herein by reference in their entirety.

Some display devices comprise a control component laminated to an optical media component, and include an electrical contact between a common electrode of the optical media component and electrical circuitry of the control component.

The control component typically comprises an array of electronic switching devices that control respective portions of the optical media component. The array of electronic switching devices typically includes one or more blanket layers of insulating material formed over the electronic switching devices, and one conventional technique for achieving said conductive connection between the control component and the optical media component involves deliberately avoiding the deposition of insulating material on the part of the electrical circuitry (contact part) used for the conductive connection to the common electrode on the optical media component.

The inventors have identified the challenge of developing an improved technique for creating the conductive connection between the control component and the optical media component.

There is hereby provided a method of creating a conductive connection between a contact element of a control component and a common electrode of an optical media component comprising compressing a compressable conductive component between the control component and the optical media component; wherein the method further comprises interposing one or more layers having a low modulus of elasticity between said contact element and said compressable component prior to said compressing.

According to one embodiment, said one or more layers having a low modulus of elasticity comprise one or more insulating layers, and said method further comprises providing a conductive connection through said one or more organic layers between said contact element and said compressable conductive component.

According to one embodiment, said compressable conductive component is a pad comprising a conductive adhesive embedded with conductive structures.

According to one embodiment, said compressable conductive component comprises a conductive paste.

According to one embodiment, said control component comprises an array of pixel electrodes and an array of electronic switching devices for controlling the electric potential at said array of pixel electrodes; and said one or more organic layers also serve to insulate said pixel electrodes from one or more underlying conductive elements.

According to one embodiment, the method further comprises forming through the one or more insulating layers both via-holes (a) for electrically conductive connections between the electronic switching devices and the respective pixel electrodes of the pixel electrode array, and one or more via-holes (b) for an electrically conductive connection between said contact element and said common electrode of said optical media component.

According to one embodiment, the method further comprises: forming on said upper surface of said one or more insulating layers an upper conductive layer electrically connected to said array of electronic switching devices and said contact element via said via-holes (a) and said one or more via-holes (b), respectively; and patterning said upper conductive layer to both define said array of pixel electrodes, and define an electrically conductive element conductively connected to said contact element and electrically isolated from said array of pixel electrodes.

According to one embodiment, said one or more layers having a low modulus of elasticity have a Young's modulus of less than about 5 GPa.

There is also hereby provided a method of producing a control component for lamination to an optical media component, the control component comprising an array of pixel electrodes and an array of electronic switching devices for controlling the electric potential at said array of pixel electrodes, and a contact element for an electrically conductive connection to a common electrode of said optical media component; said method comprising: depositing one or more insulating layers over said array of electronic switching devices and said contact element; and forming through the one or more insulating layers both via-holes (a) for electrically conductive connections between the electronic switching devices and the respective pixel electrodes of the pixel electrode array, and one or more via-holes (b) for an electrically conductive connection between said contact element and said common electrode of said optical media component.

According to one embodiment, the method comprises: forming on said upper surface of said one or more insulating layers an upper conductive layer electrically connected to said array of electronic switching devices and said contact element via said via-holes (a) and said one or more via-holes (b), respectively; and patterning said upper conductive layer to both define said array of pixel electrodes, and define an electrically conductive element conductively connected to said contact element and electrically isolated from said array of pixel electrodes.

There is also provided a method of producing an optical device comprising: laminating an optical media component to a control component produced as described above, wherein said laminating includes interposing an electrically conductive pad and/or conductive adhesive between said electrically conductive element and a common electrode of said optical media component.

There is also provided a method of producing an optical device comprising: forming on the upper surface of the insulating layer of a control component produced as described above an electrically conductive adhesive layer electrically connected to said contact element via said one or more via-holes (b); and laminating an optical media component to the control component, wherein said laminating includes interposing an electrically conductive pad between said electrically conductive adhesive layer and a common electrode of said optical media component, or directly contacting said electrically conductive adhesive layer with said common electrode of said optical media component.

There is also hereby provided a control component for laminating to an optical media component, wherein the control component comprises an array of pixel electrodes and an array of electronic switching devices for controlling the electric potential at said array of pixel electrodes, and a contact element for an electrically conductive connection to a common electrode of said optical media component; wherein said control component further comprises one or more insulating layers formed over both said array of electronic switching devices and said contact element; and conductive connections through said one or more insulating layers to provide both electrically conductive interconnects (a) between the electronic switching devices and respective pixel electrodes of the pixel electrode array, and one or more electrically conductive interconnects (b) between said contact element and said common electrode of said optical media component.

According to one embodiment, the control component comprises: a patterned upper layer of conductor material over the one or more insulating layers, wherein said upper layer of conductor material provides: said array of pixel electrodes; said electrically conductive interconnects (a); said one or more electrically conductive interconnects (b); and an electrically conductive element co-planar with said array of pixel electrodes, but electrically isolated from said array of pixel electrodes.

There is also hereby provided a display device comprising a control component as described above, and an optical media component laminated to said control component; and an electrically conductive pad and/or conductive adhesive interposed between said electrically conductive element and a common electrode of said optical media component.

According to one embodiment, the control component comprises an upper layer of electrically conductive adhesive material over the one or more insulating layers, wherein said upper layer of electrically conductive adhesive material provides: said one or more electrically conductive interconnects (b); and an electrically conductive element co-planar with said array of pixel electrodes, but electrically isolated from said array of pixel electrodes.

There is also provided a display device comprising a control component as described above, and an optical media component laminated to said control component; and an electrically conductive pad interposed between said electrically conductive element and a common electrode of said optical media component.

Embodiments of the present invention are described in detail hereunder, by way of example only, with reference to the accompanying drawings, in which:—

Figure 2:
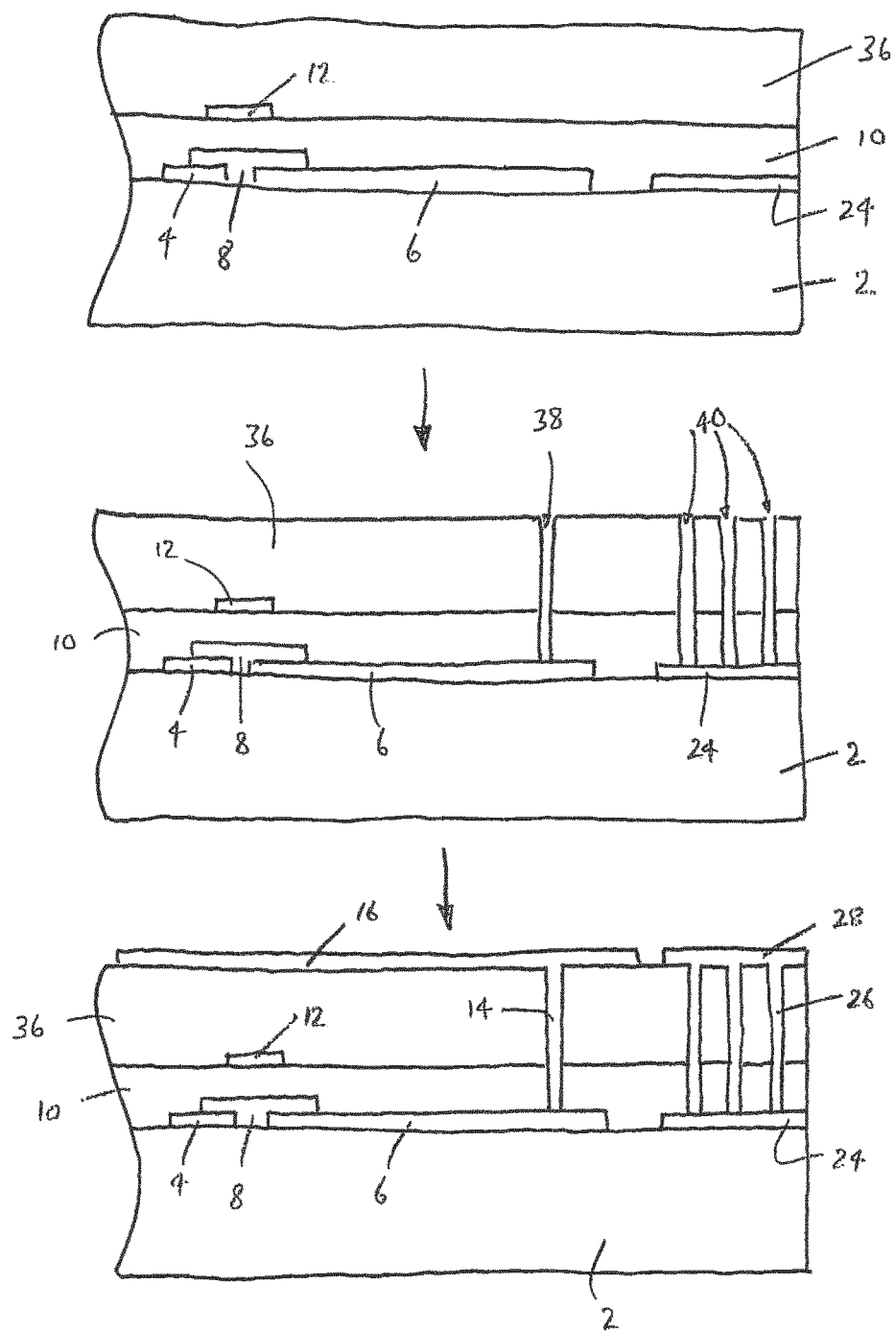
Figure 3:
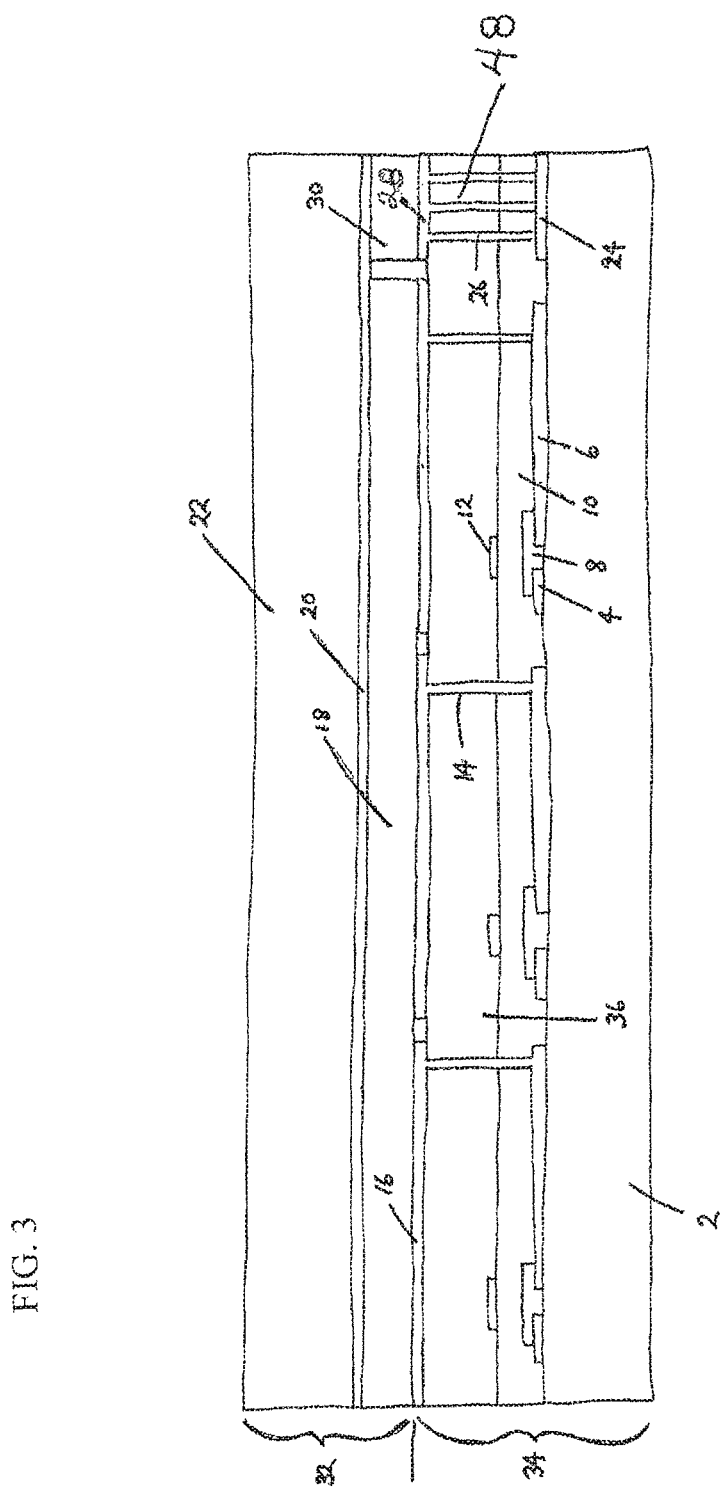
Figure 4:
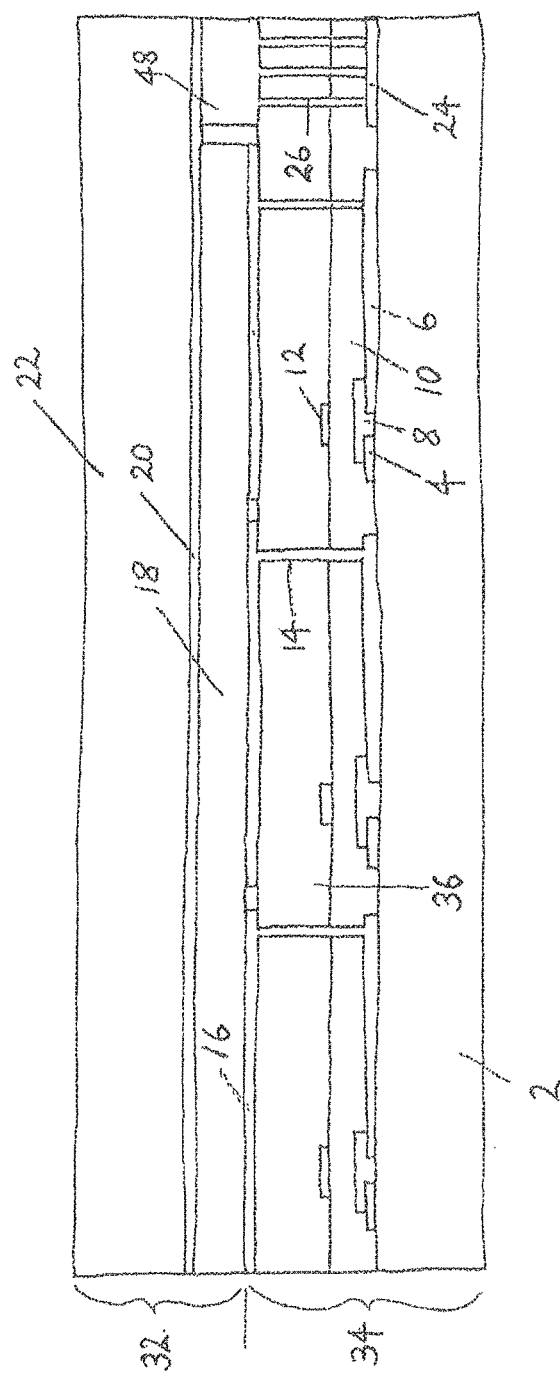

FIGS. 1 and 2 illustrate a technique according to an embodiment of the present invention; and FIGS. 3 and 4 illustrate additional details of the embodiments of the present invention.

With reference to FIGS. 1 and 2, an embodiment according to the present invention involves the production of a display device comprising a control backplane 34 and an optical media frontplane 32. The control backplane 34 comprises an array of TFTs for controlling the electric potential at respective pixel electrodes 16. The optical media component includes for example an optical active layer 18 whose optical properties can be switched between at least two states by switching the electric potential at the pixel electrodes 16. For example, the optical active layer could be a liquid crystal layer, or an electronic ink layer. For simplicity, FIG. 1 shows only three TFTs and pixel electrodes in one dimension, but a display device will typically comprise millions of TFTs and pixel electrodes to provide a high resolution display.

The production process involves depositing a layer of conductor material such as gold on a substrate 2 and patterning the layer of conductor material by e.g. photolithography or laser ablation, to form: pairs of interdigitated source and drain electrodes 4, 6; addressing lines (not shown) connecting the source electrodes of respective rows of TFTs; and a contact part 24 for making an electrical contact (ECON) to a common electrode 20 of the optical media front plane 32, as discussed below. A layer of semiconductor channel material is then deposited over the patterned conductive layer and patterned by e.g. laser ablation to form islands 8 of semiconductor material providing the semiconductor channel for each source/drain electrode pair. A layer 10 of one or more organic polymeric dielectric materials having a low Young's modulus of preferably less than about 5 GPa (further preferably no greater than about 3.2 GPa) is then deposited over the whole of the conductive layer (including the contact part 24) and the semiconductor islands 8. A second layer of conductive material such as gold is deposited over the dielectric layer 10 and patterned to form gate lines 12, each of which forms the gate electrodes for a respective column of TFTs. An upper layer of organic polymeric insulating material 36 also having a low Young's modulus of preferably less than about 5 GPa is then deposited over the dielectric layer 10 and the gate lines 12. The Young's modulus for a material is defined as the ratio of the stress along an axis over the strain along that axis in the range in which Hooke's law holds. It can be experimentally determined from the slope of a stress-strain curve created during tensile tests conducted on a sample of the material.

Next, the combination of the organic dielectric layer 10 and organic insulating layer 36 are patterned by e.g. laser ablation to form (a) an array of via-holes 38 each extending down to the drain electrode 6 of a respective TFT; and (b) a plurality of distinct via-holes 40 extending down to the electrical contact. Conductor material is then deposited over the patterned organic insulating layer 36 to both fill the via-holes 38 and 40 (thereby forming conductive interconnects 14, 26) and form a further, continuous conductor layer extending over the organic insulating layer 36. This further conductor layer is then patterned by e.g. laser ablation to (i) define an array of pixel electrodes 16 each conductively connected to a drain electrode 6 of a respective TFT, and (ii) to electrically isolate the contact part 24 from the pixel electrodes 16.

The optical media front plane 32 is thereafter laminated to the control backplane 34. The optical media front plane 32 comprises the optical active layer 18 supported on a substrate 22 via a common electrode layer 20. The common electrode layer extends beyond the edge of the optical active layer 18. A compressable conductive pad 30 comprising a conductive adhesive embedded with metallised fibres and/or metallised balls is interposed between the common electrode layer 20 and the part 28 of the upper conductive layer conductively connected to the contact part 24 (but electrically isolated from the pixel electrodes 16); and a reliable electrical connection between the contact parts 24 and 28 is created by compressing the conductive pad 30 between the optical media front plane 32 and control back plane 34. Depending on the material used for the conductive pad 30, it may be effective to apply an electrically conductive glue (or other bonding promoter) between the conductive pad 30 and said part 28 of the upper conductive layer. Alternatively, one or more droplets of electrically conductive compressable glue or paste could be deposited with relatively high precision on said part 28 of the upper conductive layer instead of the conductive pad 30. During operation of the display device, the common electrode provides a common electric potential at the opposite side of the whole of the optical active layer 18, against which the electrical potentials at the pixel electrodes 16 are independently switched.

According to one variation, the via-holes 26 used for the ECON are not filled with the same conductor material used for the pixel electrodes 16. Instead, the area of the insulating layer 36 above the contact part 24 is masked during deposition of the conductor material used for filling the via-holes 38 and forming the pixel electrodes 16; and one or more droplets of an electrically conductive glue are thereafter deposited with high precision to fill the via-holes 40 and form a layer of electrically conductive glue 48 over the part of the insulating layer 36 above the contact part 24 and via-holes 26. The resulting deposit of electrically conductive glue 48 can be configured to make direct contact with the common electrode 20 of the optical media front plane 32 (as in FIG. 4), or via a conductive pad 30 (as in FIG. 3).

The use of organic materials having a low Young's modulus between the contact part 28 of the upper conductive layer and the contact part 24 of the lower conductive layer in the region of the conductive pad (or electrically conductive glue) is beneficial for avoiding cracks forming under the pressure at which the optical media front plane 32 is laminated to the control plane 32.

The above-described technique also facilitates a reduction of the space required on the substrate for forming the ECON, because the formation of via-holes 40 through the organic dielectric layer 10 and organic insulating layer 36, and the filling of the via-holes 40 with conductive material and/or the deposition of droplets of conductive glue can be readily achieved with a relatively high degree of reliable accuracy. The above-described technique also avoids (i) the difficulty of performing the deposition of the dielectric layer 10 and insulating layer 36 with the high alignment accuracy required (or the inefficiency of trimming the edges of these layers 10, 36 after deposition) to avoid these layers 10, 26 covering a contact part 24 situated close to the rest of the electric circuitry at the same level, or (ii) having to disadvantageously increase the distance between this contact part 24 and the remainder of the electrical circuitry at the same level (and thereby increasing the footprint of the backplane 34) to an extent that the dielectric layer 10 and the insulating layer 36 can be selectively deposited other than over the contact part 24 without requiring high alignment accuracy.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method comprising:
   producing a control component for lamination to an optical media component comprising an optical active layer, the control component comprising an array of pixel electrodes and an array of electronic switching devices for controlling the electric potential at said array of pixel electrodes, and a contact element for an electrically conductive connection to a common electrode of said optical media component; wherein said control component comprises lower and upper conductor layers defining electrodes of said array of electronic switching devices, and said lower layer defines said contact element;
   depositing one or more insulating layers over said array of electronic switching devices and said contact element;
   forming, at least through the one or more insulating layers, via-holes (a) for electrically conductive connections between the electronic switching devices and the respective pixel electrodes of the pixel electrode array, and one or more via-holes (b) disposed laterally beyond a lateral edge of said optical active layer and extending down to the lower conductor layer for an electrically conductive connection between said contact element and a part of said common electrode beyond said lateral edge of the optical active layer of said optical media component; and
   thereafter depositing conductive material to fill said via-holes (a) and said one or more via-holes (b) down to said contact element.

2. The method according to claim 1, wherein depositing said conductive material to fill said via holes (a) and said one or more via-holes (b) also comprises forming a layer of conductive material on said upper surface of said one or more insulating layers, which layer of conductive material extends down to drain electrodes of said array of electronic switching devices through said via-holes (a) and extends down to said contact element through said one or more via-holes (b); and patterning said layer of conductive material to both define said array of pixel electrodes, and define an electrically conductive element conductively connected to said contact element and electrically isolated from said array of pixel electrodes.

3. The method according to claim 2, further comprising:
   laminating said optical media component to said control component, wherein said laminating includes interposing an electrically conductive pad and/or conductive adhesive between said electrically conductive element and said part of said common electrode beyond said lateral edge of said optical active layer of said optical media component.

4. The method according to claim 1, further comprising:
   forming an electrically conductive adhesive layer extending down to said contact element via said one or more via-holes (b); and
   laminating an optical media component to the control component, wherein said laminating includes interposing an electrically conductive pad between said electrically conductive adhesive layer and a common electrode of said optical media component, or directly contacting said electrically conductive adhesive layer with said common electrode of said optical media component.

5. A control component for laminating to an optical media component comprising an optical active layer, wherein the control component comprises:
   an array of pixel electrodes,
   an array of electronic switching devices for controlling the electric potential at said array of pixel electrodes, and
   a contact element for an electrically conductive connection to a common electrode of said optical media component,
   wherein said control component comprises lower and upper conductor layers defining electrodes of said array of electronic switching devices, and said lower layer defines said contact element;

wherein said control component further comprises one or more insulating layers formed over both said array of electronic switching devices and said contact element, and a patterned further conductor layer over said one or more insulating layers, and wherein said patterned further conductor layer defines said array of pixel electrodes, extends down to drain electrodes of said array of electronic switching devices through via holes (a), and also extends down to said contact element through one or more via holes (b) disposed laterally beyond a lateral edge of the optical active layer of the optical media component.

6. A display device comprising:
a control component according to claim 5, said optical media component laminated to said control component; and
an electrically conductive pad and/or conductive adhesive interposed between a part of said common electrode beyond said lateral edge of said optical active layer of said optical media component and a part of said patterned further conductor layer in contact with said contact element and isolated from said array of pixel electrodes.

7. A control component for laminating to an optical media component, wherein the control component comprises:
an array of pixel electrodes and an array of electronic switching devices for controlling the electric potential at said array of pixel electrodes, and
a contact element for an electrically conductive connection to a common electrode of said optical media component,
wherein said control component comprises lower and upper conductor layers defining electrodes of said array of electronic switching devices, and said lower layer defines said contact element;
wherein said control component further comprises:
one or more insulating layers formed over both said array of electronic switching devices and said contact element; and
a patterned further conductor layer over said one or more insulating layers, wherein said patterned further conductor layer defines said array of pixel electrodes, and extends down to drain electrodes of said array of electronic switching devices through via holes (a); and
an upper layer of electrically conductive adhesive material over the one or more insulating layers, wherein said upper layer of electrically conductive adhesive material extends down to said contact element through one or more via holes (b) and provides an electrically conductive element co-planar with said array of pixel electrodes, but electrically isolated from said array of pixel electrodes.

8. A display device comprising:
a control component according to claim 7, said optical media component laminated to said control component; and
an electrically conductive pad interposed between said electrically conductive element and a common electrode of said optical media component.

9. The method according to claim 1, comprising: depositing electrically conductive adhesive material in said one or more via-holes (b) without depositing said electrically conductive adhesive material in said via-holes (a), to form an electrically conductive adhesive layer extending from above said one or more insulating layers down to said contact element.

10. The method according to claim 9, further comprising:
laminating said optical media component to the control component, wherein said laminating includes interposing an electrically conductive pad between said electrically conductive adhesive layer and said common electrode of said optical media component, or directly contacting said electrically conductive adhesive layer with said common electrode of said optical media component.

11. The method according to claim 1, further comprising:
laminating said optical media component to said control component, and creating an electrically conductive connection between said contact element and said part of said common electrode beyond said lateral edge of said optical active layer of said optical media component.

12. The display device comprising:
a control component according to claim 5, and said optical media component laminated to said control component; and
an electrically conductive connection between said contact element and said part of said common electrode beyond said lateral edge of said optical active layer of said optical media component.

* * * * *